United States Patent [19]

Kudo et al.

[11] Patent Number: 4,911,812

[45] Date of Patent: Mar. 27, 1990

[54] PLASMA TREATING METHOD AND APPARATUS THEREFOR

[75] Inventors: Katsuyoshi Kudo, Kudamatsu; Yoshinao Kawasaki, Yamaguchi; Minolu Soraoka; Tsunehiko Tsubone, both of Kudamatsu; Kazunori Tsujimoto, Higashiyamato; Shinichi Tachi, Sayama; Saadyuki Okudaira, Ome, all of Japan

[73] Assignee: Hitachi, Ltd., Tokyo, Japan

[21] Appl. No.: 258,468

[22] Filed: Oct. 17, 1988

[30] Foreign Application Priority Data

Oct. 21, 1987 [JP] Japan .................. 62-263871
Mar. 4, 1988 [JP] Japan .................. 63-49661

[51] Int. Cl.$^4$ .................. C23C 14/34; B44C 1/22; B05D 3/06
[52] U.S. Cl. .................. 204/192.32; 204/298; 156/345; 156/643; 156/646; 422/186.05; 118/723; 118/724; 427/38
[58] Field of Search .................. 204/192.12, 192.32, 204/298 WH, 298 CS, 298 E, 298 EE, 298 MW; 156/643, 646, 345; 422/186.05, 186.22; 118/723, 724; 427/38, 39

[56] References Cited

U.S. PATENT DOCUMENTS

| 3,598,710 | 8/1971 | Dairdse .................. 204/298 E |
| 4,298,443 | 11/1981 | Maydan .................. 204/298 E X |
| 4,367,114 | 1/1983 | Steinberg et al. .................. 156/345 |
| 4,399,016 | 8/1983 | Tsukada et al. .................. 156/345 X |
| 4,534,816 | 8/1985 | Chen et al. .................. 156/345 |
| 4,776,918 | 10/1988 | Otsubo et al. .................. 156/345 |
| 4,793,975 | 12/1988 | Drage .................. 156/345 X |

Primary Examiner—Nam X. Nguyen
Attorney, Agent, or Firm—Antonelli, Terry & Wands

[57] ABSTRACT

The present invention relates to a plasma treating method and apparatus therefor. The plasma treating method comprises the steps of forming a treating gas into a plasma under reduced pressure, utilizing the plasma to treat a specimen cooled to a low temperature less than 0° C. under reduced pressure, and maintaining at least an exposed surface to an atmosphere at which the specimen is treated except a specimen place surface of a specimen table on which the specimen is placed at a temperature above a dew point temperature of gases under the atmosphere; and a plasma treating apparatus comprises a treating chamber, means for reducing and exhausting the interior of the treating chamber, means for introducing a treating gas into the treating chamber, means for forming the treating gas into a plasma, a specimen table on which the specimen treated by utilizing the plasma is placed within the treating chamber, means for cooling the specimen table so as to be able to cool the specimen to a low temperature less than 0° C., and means for maintaining at least an exposed surface within the treating chamber except a specimen place surface of the specimen table at a temperature above a dew point temperature of gases within said treating chamber, whereby even if the specimen table is cooled to a low temperature less than 0° C., adsorption of the atmospheric gas to the exposed surface within the treating chamber which is at least a pressure-reduced atmosphere exposed surface except a specimen place surface of the specimen table is suppressed, and principally the occurrence of foreign matter can be prevented and the lowering of the yield of the specimen causes by the foreign matter can be prevented.

16 Claims, 2 Drawing Sheets

PLASMA TREATING METHOD AND APPARATUS THEREFOR

BACKGROUND OF THE INVENTION

1. Field of the Invention

The present invention relates to a plasma treating method and apparatus therefor, and more particularly to a plasma treating method and apparatus therefor which is suitable for treatments such as etching treatment, film-forming treatment and the like of a specimen such as the substrate of a semiconductor element utilizing a plasma while cooling the specimen to a low temperature less than 0° C.

2. Description of the Prior Art

Techniques for cooling a specimen such as the substrate of a semiconductor element to a low temperature less than 0° C. and applying a plasma treatment thereto have been known, for example, from Japanese Patent Laid-Open No. 158627/1985, Japanese Patent Laid-Open No. 240635/1986 and the like, in which a specimen table on which a specimen is placed is cooled by, for example, liquid nitrogen or the like, the specimen is cooled to a low temperature less than 0° C. through the thus cooled specimen table, and the specimen is subjected to etching treatment utilizing a plasma.

In the plasma treating techniques disclosed, for example, in Japanese Patent Laid-Open No. 158627/1985 and Japanese Patent Laid-Open No. 240635/1986, an exposed surface within a treating chamber which is exposed to an atmosphere at which specimen is treated (hereinafter referred to as a pressure-reduced atmosphere exposed surface) except a specimen place surface of a specimen table on which specimen is placed is also cooled to a low temperature less than 0° C. similar to the specimen place surface of the specimen table. When the exposed surface is cooled to a temperature less than a dew point of a treating gas under the pressure-reduced atmosphere or reactive product produced when a specimen is treated (hereinafter referred to as an atmospheric gas), the adsorption of the atmospheric gas on the exposed surface is unavoidable. This poses problems as follows:

(1) When the growth of an adsorbed material progresses on the exposed surface within the treating chamber of the specimen table, the adsorbed material is peeled off in the form of a solid from the exposed surface, which is then formed into a source of foreign matter which constitutes an adverse affect such as the lowering of yield of the specimen.

(2) When the growth of an adsorbed material progresses on the exposed surface within the treating chamber of the specimen table, the adsorbed material is peeled off in the form of a solid from the exposed surface. This gives rise to troubles such as a blinding of an exhaust device which reduces pressure and exhausts the interior of the treating chamber.

(3) Sublimation of the adsorbed material on the exposed surface within the treating chamber of the specimen table and discharge operation of the sublimed material outside the treating chamber are separately required.

(4) When the treating chamber is opened in the state wherein the adsorbed material is present, sublimation of the adsorbed material occurs and discharge of gases outside occurs, which is dangerous for an operator.

(5) When the treating chamber is opened in the state wherein the adsorbed material is present, if the adsorbed material is a chloric-system adsorbed material, the material is reacted with moisture in air to produce a hydrochloric acid, which forms a corrosion environment to possibly damage the apparats.

(6) The adsorption of the treating gases on the exposed surface lowers the pressure within the treating chamber which is under the pressure-reduced atmosphere. Because of this, it becomes difficult to control the pressure within the treating chamber to a predetermined treating pressure, failing to treat the specimen in a satisfactory manner.

SUMMARY OF THE INVENTION

It is a principal object of the present invention to provide a plasma treating method and apparatus therefor which can prevent the lowering of yield caused by a foreign matter of a specimen which is cooled to a low temperature less than 0° C. and treated.

A plasma treating method according to the present invention comprises the steps of forming a treating gas into a plasma under reduced pressure, utilizing the plasma to treat a specimen cooled to a low temperature less than 0° C. under reduced pressure, and maintaining at least an exposed surface to an atmosphere at which said specimen is treated except a specimen place surface of a specimen table on which said specimen is placed at a temperature above a dew point temperature of gases under said atmosphere; and a plasma treating apparatus comprises a treating chamber, means for reducing and exhausting the interior of said treating chamber, means for introducing a treating gas into said treating chamber, means for forming said treating gas into a plasma, a specimen table on which the specimen treated by utilizing said plasma is placed within said treating chamber, means for cooling said specimen table so as to be able to cool said specimen to a low temperature less than 0° C., and means for maintaining at least an exposed surface within said treating chamber except a specimen place surface of said specimen table at a temperature above a dew point temperature of gases within said treating chamber, whereby even if the specimen table is cooled to a low temperature less than 0° C., adsorption of the atmospheric gas to the exposed surface within the treating chamber which is at least a pressure-reduced atmosphere exposed surface except a specimen place surface of said specimen table is suppressed.

DESCRIPTION OF THE PREFERRED EMBODIMENTS

An embodiment of the present invention will be described with reference to FIG. 1.

Figure 1:
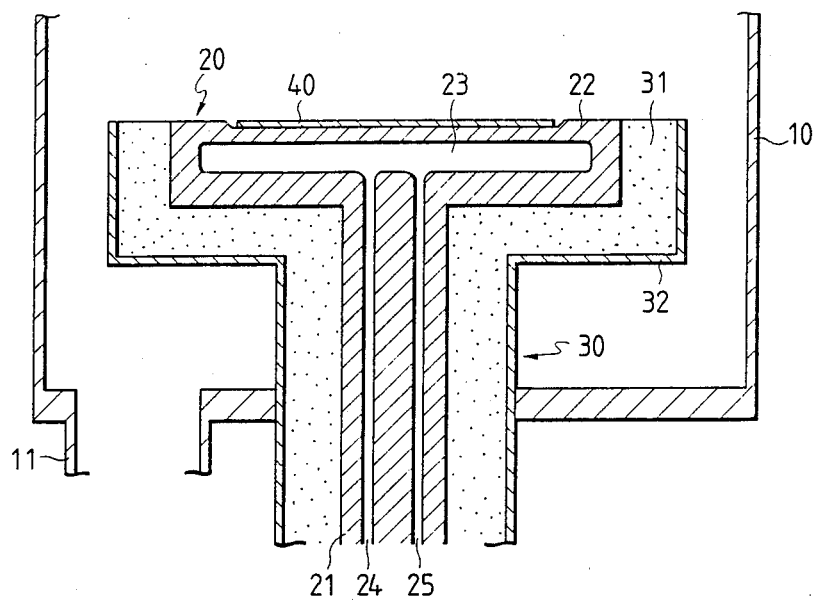
FIG. 1 is a longitudinal sectional view of essential parts of a plasma treating apparatus according to a first embodiment of the present invention.

In FIG. 1, a specimen table 20 is provided within a treating chamber 10. The specimen table 20 is composed of a specimen table shaft 21 and a specimen place table 22. The shape of the specimen table shaft 21 is a substantially columnar shape, and that of the specimen place table 22 is a substantially a disk shape. The specimen place table 22 is provided at one surface with a specimen place surface. The specimen place surface has, in this case, an area on which one specimen 40 can be placed thereon. The specimen table shaft 21 and the specimen place table 22 are formed of stainless steel or aluminum. The specimen table shaft 21 has its upper portion projected from the bottom wall of the treating chamber 10 into the treating chamber 10, and the its lower portion projected outside the treating chamber 10. On the top of the specimen table shaft 21 located within the treating chamber 10 is substantially horizontally provided the specimen place table 22 with the specimen place surface serving as an upper surface. On the surface except the specimen place surface of the specimen table 20 is provided temperature maintaining means 30 for maintaining a temperature of said surface at a temperature above a dew point temperature of atmospheric gas. The temperature maintaining means 30 is composed of a heat insulating material 31 and a cover 32, in this case. The heat insulating material 31 is provided on the surface except the specimen place surface of the specimen place table 22, namely, a side surface, allowed surface and a peripheral surface of the specimen table shaft 21, namely, an exposed surface within the treating chamber 10, a surface corresponding to the bottom wall of the treating chamber 10 and an exposed surface outside the treating chamber 10. The heat insulating material 31 is retained by a cover 32. The cover 32 is air-tightly provided on the bottom wall of the treating chamber 10. The specimen place table 22 is interiorly formed with a coolant flowpassage 23 corresponding to the specimen place surface. The specimen table shaft 21 and the specimen place table 22 are respectively interiorly formed with a coolant supply path 24 and a coolant discharge path 25 which are respectively communicated with the coolant flowpassage 23. The coolant supply path 2 is connected by means of a coolant supply pipe (not shown ) to a coolant supply source (not shown) for cooling the specimen 40 to a predetermined temperature. The heat insulating material 31 is selected from those which can maintain the temperature of the exposed surface within the treating chamber 10 of the cover 32, corresponding to the temperature of the specimen 40, at a temperature above a dew point temperature of the atmospheric gas under the pressure of the treating chamber 10. For example, where the temperature of the specimen 40 is approximately $-40°$ C., the heat insulating material selected includes, for example, heat insulating resins such as fluorine plastics, ceramics or foam styrol. Where the temperature of the specimen 40 is approximately $-150°$ C., the heat insulating material selected includes, for example, heat insulating resins such as fluorine plastics, ceramics or perlite. The cover is formed of stainless steel, aluminum or ceramics. In this case, an exhaust nozzle 11 is provided on the bottom wall within the treating chamber 10, a pressure-reduced exhaust device (not shown) is connected through an exhaust pipe (not shown) to the exhaust nozzle 11.

The treating chamber 10 has treating-gas introducing means (not shown) and plasma producing means (not shown) for forming the treating gas introduced into the treating chamber 10 into a plasma.

The plasma producing means used are as follows:

(1) A magnetic-field type microwave plasma producing means in which a treating gas is formed into a plasma by action of an electric field including a microwave and a magnetic field, as disclosed, for example, in U.S. Pat. No. 4,559,100.

In the microwave plasma etching apparatus disclosed in U.S. Pat. No. 4,559,100, a member composed of a sample stage 14 and a supporting axis 17 corresponds to the specimen table 2O.

(2) A so-called non-magnetic field type microwave plasma producing means in which a treating gas is formed into a plasma by action of an electric field including a microwave.

In the dry chemical etching apparatus disclosed in U.S. Pat. No. 4,481,229, a member composed of a metal electrode 6 and a dielectric support 7 corresponds to the specimen table 20.

(3) A so-called magnetron discharge type plasma producing means in which a treating gas is formed into a plasma by action of a high frequency electric field and a magnetic field, as disclosed, for example, in U.S. Pat. No. 4,631,106.

In the plasma processor disclosed in U.S. Pat. No. 4,631,106, the electrode 30 corresponds to the specimen table 20.

(4) A so-called high frequency glow discharge type plasma producing means in which a treating gas is formed into a plasma by action of a high frequency electric field, as disclosed, for example, in U.S. Pat. No. 4.352.974.

In the plasma etcher disclosed in U.S. Pat. No. 4,352,974. the disc electrode 14 corresponds to the specimen table 20.

In FIG. 1, one (in this case) specimen 40 is carried into the treating chamber 10 by a known transport means (not shown) and installed in an upward attitude on the surface to be treated of the specimen place surface of the specimen place table 22. On the other hand, a coolant is supplied from the coolant supply source to the coolant flowpassage 23 through the coolant supply path 24, and the coolant after having passed through the coolant flowpassage 23 is discharged outside the system from the coolant discharge path 25. Thereby, the specimen table 2O , that is, the specimen table shaft 21 and the specimen place table 2 are cooled. The temperature of the exposed surface within the treating chamber 10 of the cover 32 i retained at a level above a dew point temperature of the atmospheric gas under the pressure within the treating chamber 10 by the heat insulating material 31. The specimen 40 is cooled and retained at a predetermined temperature less than 0° C. through the specimen table 20. On the other hand, the treating gas introduced into the treating chamber 10 is formed into a plasma by the plasma producing means, and the surface to be treated of the specimen 40 is suitably treated by the plasma. The treating gas prior to treatment of the specimen 40, the treating gas during the treatment, the reacted product and the treating gas after treatment and the reacted product are discharged from the exhaust nozzle 11 without being adsorbed by the cover 32.

In the present embodiment, the adsorption of the atmospheric gas to the cover can be suppressed, and therefore, the following effects may be obtained.

(1) Since no peeling of material in the form of a solid from the cover occurs, no foreign matter is produced, and accordingly, the lowering of yield of the specimen can be prevented.

(2) Since no peeling of material in the form of a solid from the cover occurs, occurrence of troubles such as blinding or the like of the pressure-reduced exhaust device can be prevented.

(3) Special operations such as sublimation of an adsorbed material from the cover and the discharge of the sublimated material outside the treating chamber can be eliminated.

(4) Since even if the treating chamber is opened, no release of gas to the outside occur, the safety of an operator can be secured.

(5) Even if the treating chamber is opened, no corrosion environment is formed, and the danger of damage to the apparatus can be eliminated.

(6) The lowering of pressure within the treating chamber does not occur, and the pressure within the treating chamber can be easily controlled to a predetermined treating pressure. Therefore, predetermined treatment of a surface to be treated of a specimen can be carried out in a satisfactory manner. For example, where $SF_6$ is used as a treating gas, $SF_6$ is liquefied at approximately $-130°$ C. to $-150°$ C. under gas pressure of 10 to 100 m Torr. That is, where the specimen table is cooled by a liquid nitrogen, the temperature of the surfaces except the specimen place surface of the specimen table is less than $-150°$ C. In prior art in which no measures for heat insulation with respect to the exposed surface within the treating chamber except the specimen place surface of the specimen table is taken, a part of $SF_6$ is adsorbed by the exposed surface within the treating chamber except the specimen place surface of the specimen table. Therefore, pressure within the treating chamber lowers to make it difficult to control the pressure within the treating chamber to a predetermined treating pressure. On the other hand, in the present embodiment, since the cover is heat-insulated from the specimen table by the function of the heat insulating material, the adsorption of the heat insulating material to the cover does not occur to overcome the problem as noted above.

Further, since in the present embodiment, the surface corresponding to the bottom wall of the treating chamber of the specimen table shaft and the exposed surface outside the treating chamber other than the exposed surface within the treating chamber except the specimen place surface of the specimen table are also heat-insulated, the adsorption of moisture or carbon dioxide gas in air in these surfaces can he suppressed. Therefore, where parts formed of electric insulating material are used corresponding to these parts, deterioration of these parts due to the moisture absorption of electric insulating characteristics can be prevented, and variation in treating process of the specimen and damage of the apparatus can be also prevented.

While in the above-described embodiment, the top of the heat insulating material has been exposed into the treating chamber, it is noted that the cover can be extended corresponding thereto However, where the cover is formed of stainless steel or aluminum, the cover need be heat-insulated from the specimen place table.

Figure 2:
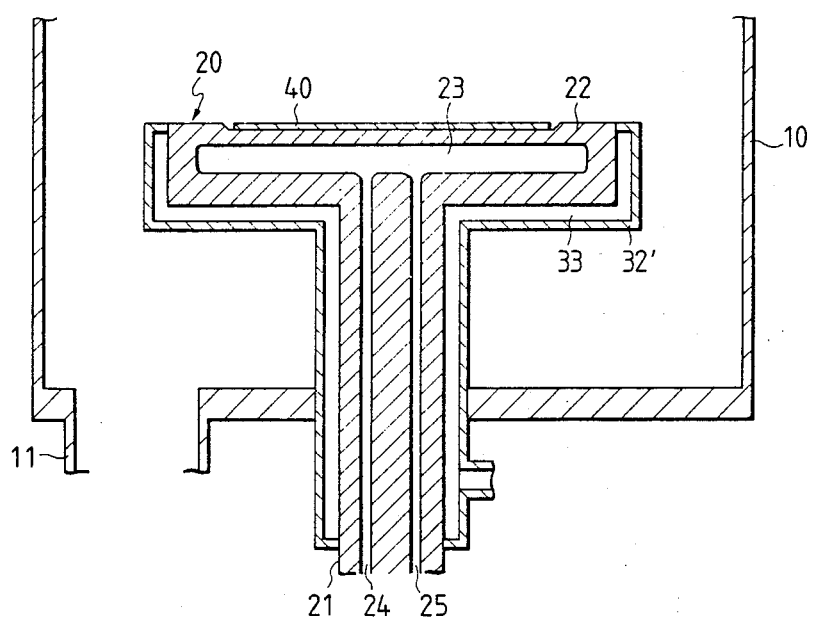
FIG. 2 is a longitudinal sectional view of the same parts as those shown in FIG. 1 according to a second embodiment of the present invention.

FIG. 2 illustrates a second embodiment according to the present invention, which is different from FIG. 1 which illustrates the first embodiment according to the present invention in that a pressure reducing space 33 is provided in the surface except the specimen place surface of the specimen place table 22 and the peripheral surface of the specimen table shaft 21.

In FIG. 2, in the surfaces except the specimen place surface of the specimen place table 22 and the peripheral surface of the specimen table shaft 21 are provided a cove 32' with the space 33 formed therefrom. The space 33 is a space discontinuously isolated from the treating chamber 10. A pressure-reduced exhaust device (not shown) is connected to the cover 32' while being communicated with the space 33. This pressure-reduced exhaust device can be used jointly with a device (not shown) for reducing and exhausting the interior of the treating chamber 10. The cover 32' is provided on the specimen table 20 through a heat insulating material or the cover 32' is formed of a material having heat insulating and air tight properties and is directly provided on the specimen table 20. Anyhow, it is necessary to prevent the lowering of temperature of the cover 32' due to the heat conduction with the specimen table 20. The same parts in FIG. 2 as those shown in FIG. 1 are indicated by the same reference numerals and will not be further explained.

In FIG. 2, the space 33 is reduced in pressure and exhausted by the pressure-reduced exhaust device, and the space 33 forms a pressure-reduced heat insulating layer. Accordingly, even if the specimen table 20 is cooled, the cover 32' is prevented from being cooled to prevent the adsorption of the treating gas and the reacted product to the cover 32'. In the above-described second embodiment, the effects similar to those of the first embodiment can be obtained. As compared with the first embodiment, the heat insulating effect can be further enhanced, and the heat insulation executing work can be further simplified.

Figure 3:
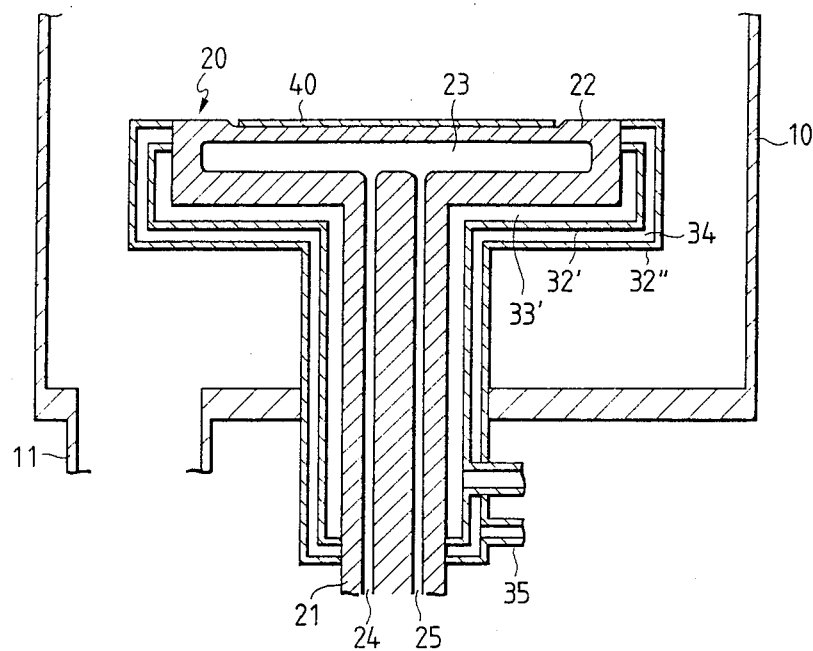
FIG. 3 is a longitudinal sectional view of the same parts as those shown in FIG. 1 according to a third embodiment.

FIG. 3 illustrates a third embodiment of the present invention, which is different from FIG. 2 which illustrates the second embodiment of the present invention in that the cover 32' is surrounded to form a further space 34, and a heat increasing medium, for example, air, is supplied to the space 34.

That is, in FIG. 3, the space 34 is formed by surrounding the cover 32' to provide a cover 32''. The space 34 is provided with a pipe 35 for supplying air and a pipe (not shown) for discharging air from the space 34. The pipe 35 is connected to an air supplying pump (not shown). The pipe for discharging air is opened to atmosphere outside the treating chamber 10. The space 34 is of course isolated from the interior of the treating chamber 10 while maintaining the air tightness therebetween. Same parts in FIG. 3 as those shown in FIG. 2 are indicated at the same reference numerals and will not be further described.

Employment of such an arrangement as described above is effective for the case where the cover 32' formed of stainless steel or aluminum is directly mounted on the specimen table 20. That is, cooling of the cover 32' through the specimen table 20 is sufficiently suppressed by the hat increasing action of air passing through the space 34.

Figure 4:
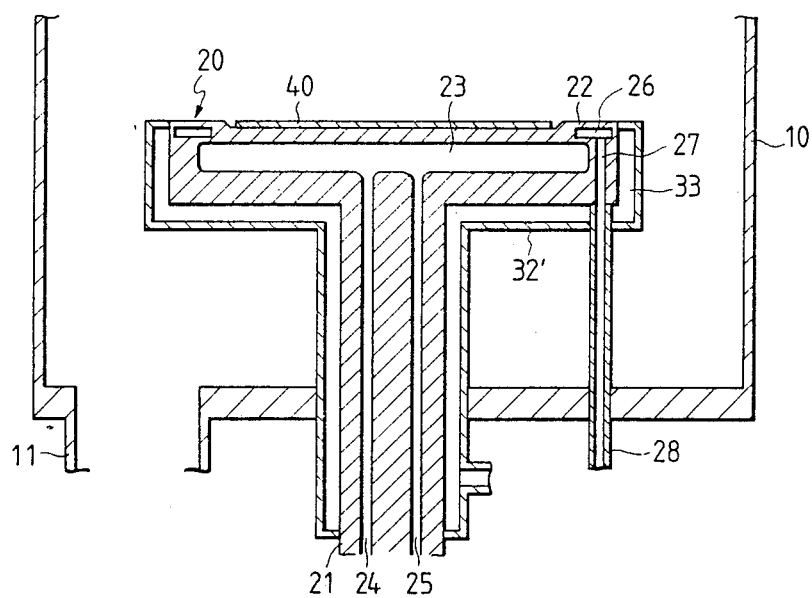
FIG. 4 is a longitudinal sectional view of the same parts as those shown in FIG. 1 according to a fourth embodiment of the present invention.

FIG. 4 illustrates a fourth embodiment of the present invention, which is different from FIG. 2 which illustrates the second embodiment of the present invention in that a heat increasing medium flowpassage 26 is formed within the specimen place table 22, and a heat increasing medium, for example, air, is supplied to the flowpassage 26.

That is, in FIG. 4, the heat increasing medium flowpassage 26 is formed corresponding to the upper surface except a mounting portion with respect to the specimen place table 22 of the cover 32' and the specimen place surface of the specimen place table 22. The specimen place table 22 is interiorly formed with a heat increasing medium supply path 27 in communication with the heat increasing flowpassage 26 and a heat increasing medium discharge path (not shown). The heat increasing medium flowpassage 26 is provided with a pipe 28 for supplying air through the heat increasing medium supply path 27 and a pipe (not shown) for discharging air through the heat increasing medium discharge path from the heat increasing medium flowpassage 26. The pipe 28 is connected to a pump (not shown) for supplying air. The pipe for discharging air is opened to atmosphere outside the treating chamber 10. The same parts in FIG. 4 as those shown in FIG. 2 are indicated at the same reference numeral and will not be further explained.

In the case where such an arrangement as described above is employed, the temperature gradient in the range from the neighborhood of the specimen place surface of the specimen place table 22 to the mounting portion of the cover 32' is slightly gentler than that of the second embodiment to sufficiently suppress cooling of the cover 32' through the specimen table.

It is to be noted that other than the above-described embodiments, a flowpassage through which a heat increasing medium flows is formed corresponding to the exposed surface within the treating chamber except the specimen place surface of the specimen table or a heating heater is provided, by which action, the temperature of the exposed surface is maintained at a level above a dew point temperature of the atmospheric gas.

As described above, the present invention provides a plasma treating method comprising the steps of forming a treating gas into a plasma under reduced pressure, utilizing the plasma to treat a specimen cooled to a low temperature less than 0° C. under reduced pressure, and maintaining at least an exposed surface to an atmosphere at which said specimen is treated except a specimen place surface of a specimen table on which specimen is placed at a temperature above a dew point temperature of gases under said atmosphere; and a plasma treating apparatus comprising a treating chamber, means for reducing and exhausting the interior of said treating chamber, means for introducing a treating gas into said treating chamber, means for forming said treating gas into a plasma, a specimen table on which the specimen treated by utilizing said plasma is placed within the said treating chamber, means for cooling said specimen table so as to be able to cool said specimen to a low temperature less than 0° C., and means for maintaining at least an exposed surface within said treating chamber except a specimen place surface of said specimen table at a temperature above a dew point temperature gases within said treating chamber. Therefore, even if the specimen table is cooled to a low temperature less than 0° C., adsorption of the atmospheric gas to the exposed surface within the treating chamber which is at least a pressure-reduced atmosphere exposed surface except a specimen place surface of said specimen table can be suppressed. Accordingly, the present invention principally has the effects that an occurrence of foreign matter can be prevented, and a lowering of yield of a specimen due to the presence of the foreign matter can be prevented.

What is claimed is:

1. A plasma treating method comprising the steps of forming a treating gas into a plasma under reduced pressure, utilizing the plasma to treat a specimen cooled to a low temperature less than 0° C. under reduced pressure, and maintaining at least an exposed surface to an atmosphere at which said specimen is treated except a specimen place surface of a specimen table on which said specimen is placed at a temperature above a dew point temperature of gases under said atmosphere.

2. A plasma treating method according to claim 1, wherein said treating gas is formed into a plasma by action of an electric field including a microwave and a magnetic field, said specimen cooled to a low temperature less than 0° C. under reduced pressure is treated by utilizing said plasma, and at least said exposed surface of said specimen table is maintained at a temperature above a dew point temperature of said atmospheric gas.

3. A plasma treating method according to claim 1, wherein said treating gas is formed into a plasma by action of an electric field including a microwave, said specimen cooled to a low temperature less than 0° C. under reduced pressure is treated by utilizing said plasma, and said exposed surface of said specimen table is maintained at a temperature above a dew point temperature of said atmospheric gas.

4. A plasma treating method according to claim 1, wherein said treating gas is formed into a plasma under reduced pressure by action of a high frequency electric field and a magnetic field, said specimen cooled to a low temperature less than 0° C. under reduced pressure is treated by utilizing said plasma, and at least said exposed surface of said specimen table is maintained at a temperature above a dew point temperature of said atmospheric gas.

5. A plasma treating method according to claim 1, wherein said treating gas is formed into a plasma under reduced pressure by action of a high frequency electric field, said specimen cooled to a low temperature less than 0° C. under reduced pressure is treated by utilizing the plasma, and at least said exposed surface of said specimen table is maintained at a temperature above a dew point temperature of said atmospheric gas.

6. A plasma treating method comprising the steps of pressure-reducing and exhausting the interior of a treating chamber, introducing a treating gas into said treating chamber, forming said treating gas into a plasma within said treating chamber, placing a specimen on a specimen place surface of a specimen table provided within said treating chamber to cool said specimen to a low temperature less than 0° C. through said specimen table, utilizing said plasma to treat the cooled specimen, and maintaining at least an exposed surface within said treating chamber except said specimen place surface of said specimen table at a temperature above a dew point temperature of gases within said treating chamber.

7. A plasma treating apparatus comprising a treating chamber, means for pressure-reducing and exhausting the interior of said treating chamber, means for introducing a treating gas into said treating chamber, means for forming said treating gas into a plasma, a specimen table on which a specimen to be treated by utilizing said plasma is placed within said treating chamber, means for cooling said specimen table so that said specimen may be cooled to a temperature less than 0° C., and means for maintaining at least an exposed surface within said treating chamber except a specimen place surface of said specimen table at a temperature above a dew point temperature of gases within said treating chamber.

8. A plasma treating apparatus according to claim 7, wherein a heat insulating material is provided on said exposed surface, said heat insulating material being retained by a cover.

9. A plasma treating apparatus according to claim 8, wherein said heat insulating material is selected to have a temperature above a dew point temperature of gases within said treating chamber under pressure within said treating chamber corresponding to the temperature of said specimen so as to be able to maintain the temperature of said cover.

10. A plasma treating apparatus according to claim 7, wherein a pressure-reduced space air-tightly isolated from said treating chamber is provided in said exposed surface.

11. A plasma treating apparatus according to claim 7, wherein a pressure-reduced space air-tightly isolated from said treating chamber is provided in said exposed surface, and a heat increasing space air-tightly isolated from said treating chamber and the pressure-reduced space is provided around said pressure-reduced space.

12. A plasma treating method comprising the steps of:
providing a treating chamber having a specimen table therein, wherein said specimen table has a specimen place surface on which a specimen may be placed and wherein exposed surfaces and sides of said treating chamber except said specimen place surface are separated from said specimen table by a heat insulating region;
introducing a treating gas into said treating chamber;
forming said treating gas into a plasma within said treating chamber;
supplying a coolant of low temperature less than 0° C. into said specimen table;
placing a specimen on said specimen place surface of said specimen table; and
utilizing said plasma to treat said specimen.

13. A plasma treating apparatus comprising;
a treating chamber;
means for reducing pressure inside said treating chamber;
means for introducing a treating gas into said treating chamber;
means for forming said treating gas into a plasma;
a specimen table having a specimen place surface on which a specimen to be treated utilizing said plasma may be placed within said treating chamber;
means for cooling said specimen table so that said specimen may be cooled to a temperature less than 0° C.; and
means for providing a heat insulating region separating exposed surfaces inside said treating chamber except said specimen place surface from said specimen table.

14. A plasma treating apparatus according to claim 13, wherein said heat insulating region comprises a heat insulating material.

15. A plasma treating apparatus according to claim 14, wherein said means for forming a heat insulating region comprises a cover surrounding said heat insulating material which surrounds said specimen table except at said specimen place surface.

16. A plasma treating apparatus according to claim 13, wherein said heat insulating region comprises a pressure-reduced space.

* * * * *